US 7,894,236 B2

(12) United States Patent
Oh et al.

(10) Patent No.: US 7,894,236 B2
(45) Date of Patent: Feb. 22, 2011

(54) NONVOLATILE MEMORY DEVICES THAT UTILIZE READ/WRITE MERGE CIRCUITS

(75) Inventors: Hyung-rok Oh, Gyeonggi-do (KR); Woo-yeong Cho, Gyeonggi-do (KR); Sang-beom Kang, Gyeonggi-do (KR); Joon-min Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 479 days.

(21) Appl. No.: 11/945,443

(22) Filed: Nov. 27, 2007

(65) Prior Publication Data
US 2008/0151652 A1 Jun. 26, 2008

(30) Foreign Application Priority Data
Dec. 20, 2006 (KR) ............... 10-2006-0131242

(51) Int. Cl.
G11C 7/00 (2006.01)
G11C 7/12 (2006.01)
(52) U.S. Cl. ............ 365/148; 365/189.14; 365/189.06; 365/189.09; 365/203; 365/204
(58) Field of Classification Search ........... 365/148, 365/158, 163, 171, 173, 189.06, 189.09, 365/189.14, 203, 204
See application file for complete search history.

(56) References Cited
U.S. PATENT DOCUMENTS

| | | | | |
|---|---|---|---|---|
| 6,154,404 A * | 11/2000 | Hwang | ............ | 365/205 |
| 6,982,913 B2 | 1/2006 | Oh et al. | | |
| 2005/0030814 A1 * | 2/2005 | Oh et al. | ............ | 365/222 |
| 2006/0146634 A1 * | 7/2006 | Osada et al. | ............ | 365/226 |
| 2006/0265548 A1 * | 11/2006 | Symanczyk et al. | ......... | 711/106 |

FOREIGN PATENT DOCUMENTS

| | | |
|---|---|---|
| JP | 2006-134400 | 5/2006 |
| KR | 1999-0076171 | 10/1999 |
| KR | 1999-0084935 | 12/1999 |
| KR | 1020050029013 A | 3/2005 |
| KR | 1020050118332 A | 12/2005 |
| KR | 100663368 B1 | 12/2006 |

OTHER PUBLICATIONS

Korean Notice of Allowance, Dated May 27, 2008, for Corresponding Korean Patent Application No. 10-2006-0131242, (with reference to IDS Aug. 29, 2008).
English Translation of Korean Notice of Allowance (1 page) for corresponding Korean Patent Application No. KR10-2006-0131242, Mailing Date: May 27, 2008. (Please Note: References already submitted on previous 1449 submitted on Aug. 26, 2008).

* cited by examiner

*Primary Examiner*—J. H. Hur
(74) *Attorney, Agent, or Firm*—Myers Bigel Sibley & Sajovec

(57) ABSTRACT

An integrated circuit memory device includes an array of nonvolatile memory cells (e.g., variable resistance cells) having a first plurality of lines electrically coupled to memory cells therein. A read/write control circuit is provided. The read/write control circuit includes a read/write merge circuit and a column selection circuit. The read/write control circuit, which is configured to drive a selected one of the first plurality of lines with unequal write and read voltages during respective write and read operations, includes a compensating unit. This compensating unit is configured to provide a read compensation current to the selected one of the first plurality of lines circuit during the read operation.

10 Claims, 5 Drawing Sheets

NONVOLATILE MEMORY DEVICES THAT UTILIZE READ/WRITE MERGE CIRCUITS

REFERENCE TO PRIORITY APPLICATION

This application claims the benefit of Korean Application No. 2006-131242, filed Dec. 20, 2006, the disclosure of which is hereby incorporated herein by reference.

FIELD OF THE INVENTION

The present invention relates to nonvolatile memory devices and methods of operating same and, more particularly, to nonvolatile memory devices and methods of operating the same.

BACKGROUND OF THE INVENTION

Some examples of nonvolatile memory devices using resistance materials include resistive random access memory (RRAM) devices, phase-changeable random access memory (PRAM) devices and magnetic random access memory (MRAM) devices. Dynamic random access memory (DRAM) devices or flash memory devices store data by using charges, while nonvolatile memory devices use resistance materials to store data using a change in resistance of a variable resistance material (RRAM), a state change of a phase change material like a chalcogenide alloy (PRAM) or a change in resistance of a magnetic tunnel junction (MTJ) thin film according to the magnetization of a ferromagnetic material (MRAM), for example.

Here, resistive memory cells include variable resistance materials between an upper electrode and a lower electrode, and a resistance level of the variable resistance materials changes according to a voltage that is applied to the upper and lower electrodes. Examples of such resistive memory cells are disclosed in U.S. Patent Publication No. 2005/0058009 and U.S. Patent Publication No. 2004/0027849. In particular, a filament that serves as a current path of a cell current is formed in the variable resistance material. A state in which a part of the filament is disconnected may be defined as a reset state, a high-resistance state, and reset data (data 1). A state in which the filament is connected may be defined as a set state, a low-resistance state, and set data (data 0).

A reset voltage that has a voltage level at which the filament may be disconnected is supplied to write reset data into the resistive memory cells. A set voltage that has a voltage level at which the filament may be reconnected is supplied to write set data into the resistive memory cells. Further, a voltage that has a voltage level that is too low to change the state of the filament is supplied to read the stored data to find out whether the read data is reset data or set data.

SUMMARY OF THE INVENTION

An integrated circuit memory device according to an embodiment of the invention includes an array of nonvolatile memory cells having a first plurality of lines electrically coupled to memory cells therein. The nonvolatile memory cells may be variable-resistance memory cells and the first plurality of lines may be bit lines. A read/write control circuit is also provided. The read/write control circuit is configured to drive a selected one of the first plurality of lines with unequal write and read voltages during respective write and read operations. The read/write control circuit includes a compensating unit configured to provide a read compensation current to the selected one of the first plurality of lines during the read operation. This compensating unit is disabled during the write operation.

According to additional embodiments of the invention, the read/write control circuit may also include a line controller, which is configured to regulate the selected one of the first plurality of bit lines at the read voltage during the read operation and regulate the selected one of the first plurality of bit lines at the write voltage during the write operation. This regulation may be performed using a comparator having a first input terminal electrically coupled to a sensing node (NS) in the read/write control circuit, which is driven with the compensating current during the read operation. The read/write control circuit may further include a precharge unit configured to drive the sensing node with a precharge current during a portion of the read operation and a discharge unit configured to discharge the sensing node in preparation for a read operation.

Still further embodiments of the invention include sensing a read voltage on a bit line electrically connected to a variable-resistance memory cell during an operation to read a state of the memory cell while simultaneously supplying a read compensating current to the bit line. The magnitude of the read compensating current is sufficient to boost a voltage on the bit line when the memory cell is in a relatively high resistance state, but insufficient to appreciably boost a voltage on the bit line when the memory cell is in a relatively low resistance state.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Figure 1:
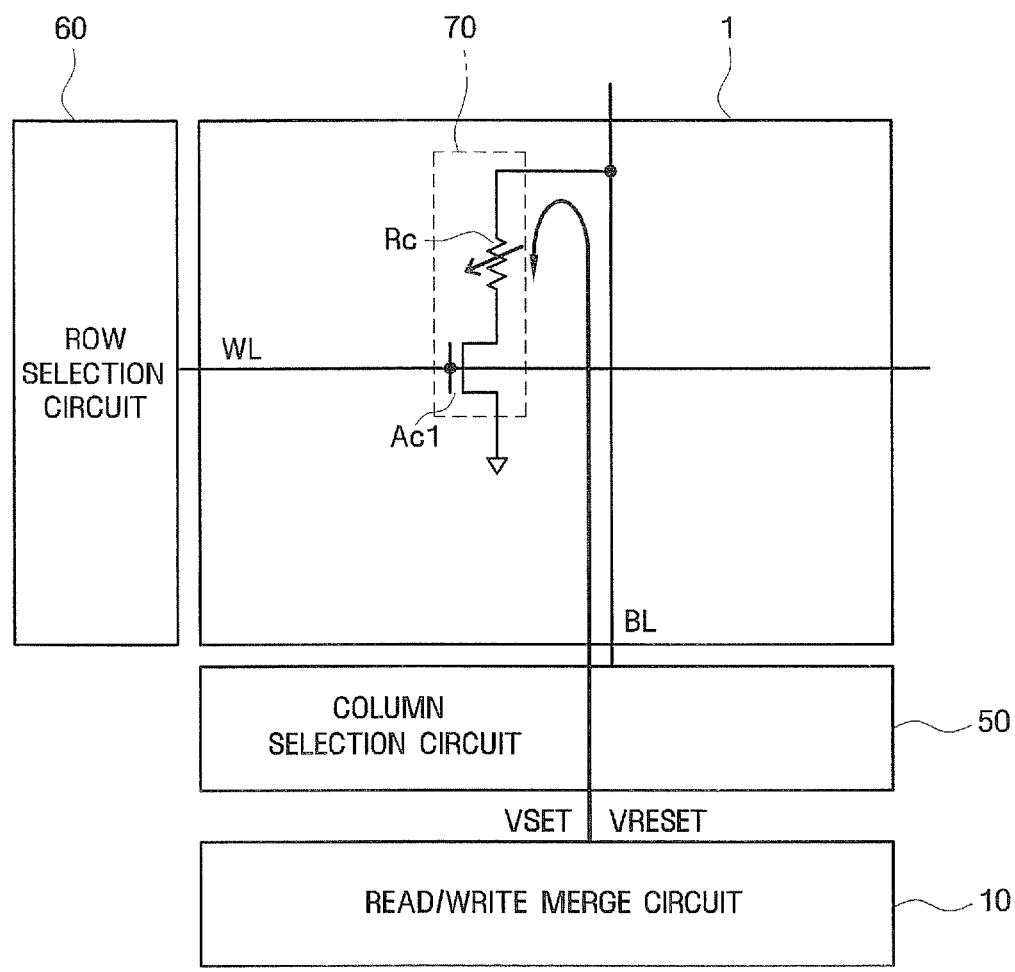
FIG. 1 is a block diagram illustrating a nonvolatile memory device according to an embodiment of the invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the scope of the invention to those skilled in the art. Like reference numerals refer to like elements throughout the specification.

It will be understood that when an element is referred to as being "connected to" or "coupled to" another element, it can be connected or coupled to the other element or intervening elements may be present. In contrast, when an element is referred to as being "directly connected to" or "directly coupled to" another element, there are no intervening elements present. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

The present invention will now be described more fully with reference to the accompanying drawings, in which preferred embodiments of the invention are shown.

Hereinafter, a description will be made of embodiments of the present invention by using resistive random access memory (RRAM) devices. However, it will be understood by those skilled in the art that the present invention can be applied to nonvolatile memory devices, such as phase-changeable random access memory (PRAM) devices, magnetic RAM (MRAM) devices, and the like, which use resistance materials.

FIG. 1 is a block diagram illustrating a nonvolatile memory device according to an embodiment of the present invention. The nonvolatile memory device shown in FIG. 1 may be, for example, a uni-directional resistive memory device, but is not limited thereto. Referring to FIG. 1, the nonvolatile memory device according to the embodiment of the present invention includes a memory cell array 1, a row selection circuit 60, a column selection circuit 50, and a read/write merge circuit 10. The memory cell array 1 may include a plurality of bit lines BL, a plurality of word lines WL, and a plurality of nonvolatile memory cells 70. Each of the nonvolatile memory cells 70 is coupled to a corresponding one of the bit lines BL and a corresponding one of the word lines WL. Each of the nonvolatile memory cells 70 may include a variable resistive element Rc, which has a different resistance level according to stored data, and an access element Ac1 that controls a cell current flowing through the variable resistive element Rc. A filament that serves as a current path for the cell current may be formed inside the variable resistive element Rc. A state in which a part of the filament is disconnected is defined as a reset state, and a state in which the filament is fully connected is defined as a set state. The variable resistive element may be formed of a material such as NiO. Here, the access element Ac1 is shown as an FET transistor, but the access element may be another type of switching device. For example, a diode, a PNP bipolar transistor, an NPN bipolar transistor, and similar switching devices may be used as the access element Ac1.

The row selection circuit 60 and the column selection circuit 50 designate a row and a column of a nonvolatile memory cell, respectively, so that a nonvolatile memory cell 70 may be selected from a plurality of other nonvolatile memory cells 70 in the memory cell array 1. The read/write merge circuit 10 and the column selection circuit 50 are collectively referred to herein and in the claims as a read/write control circuit.

The read/write merge circuit 10 performs read/write operations in the selected nonvolatile memory cell 70. That is, the read/write merge circuit 10 supplies a reset voltage VRESET, which has a voltage level at which the filament may be disconnected, and writes reset data into the nonvolatile memory cell. The read/write merge circuit 10 may also supply a set voltage VSET, which has a voltage level at which the filament may be reconnected, and thereby write set data into the nonvolatile memory cell. Moreover, the read/write merge circuit 10 can supply a clamp voltage that has a voltage level too low to change a state of the filament and thereby read stored data to find out whether the data is reset data or set data. Here, the set voltage VSET has a higher voltage level than the reset voltage VRESET, and a clamp voltage VRD (i.e., a clamped read voltage) has a lower voltage level than the reset voltage VRESET.

In particular, in the nonvolatile memory device according to the embodiment of the present invention, a circuit that performs a write operation and a circuit that performs a read operation are merged. Specifically, a circuit that supplies the reset voltage VRESET and the set voltage VSET to the bit line BL that is coupled to the nonvolatile memory cell 70 during a write operation, and a circuit that clamps the bit line BL during a read operation are merged. This will be described in detail with reference to FIGS. 2 to 5.

In the embodiment of FIG. 1, the read/write merge circuit 10 is coupled to the bit line BL so as to write data into the nonvolatile memory cell 70 or read the data from the nonvolatile memory cell 70, but the present invention is not limited to this configuration. For example, the read/write merge circuit 10 may be coupled to the word line WL in alternative embodiments of the invention.

Figure 2:
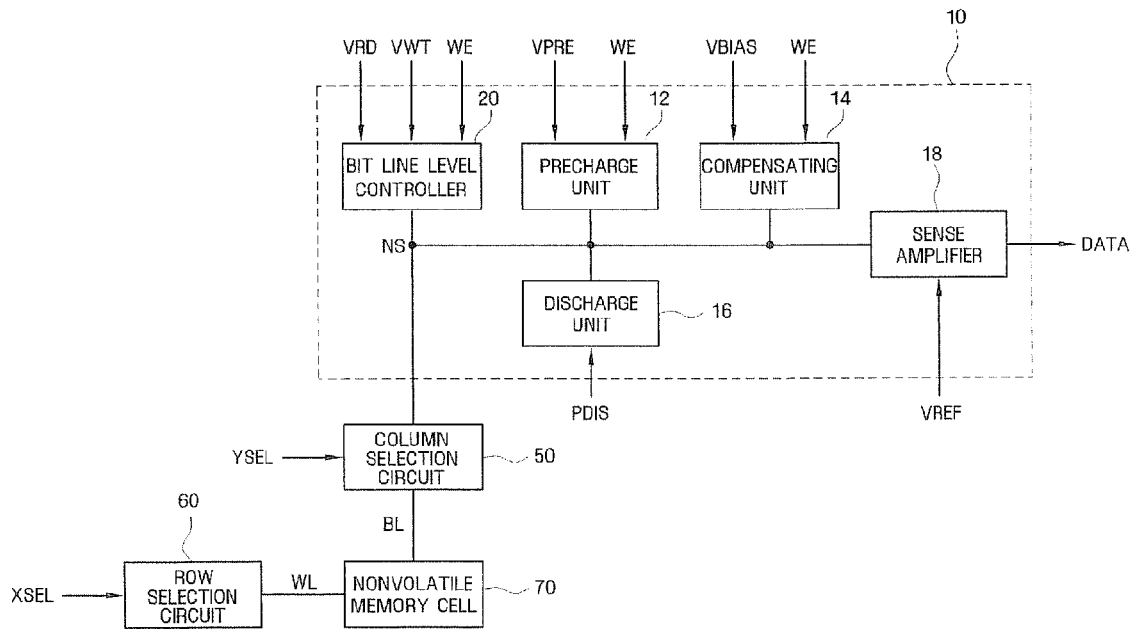
FIG. 2 is a block diagram illustrating a read/write merge circuit that is used for a nonvolatile memory device according to an embodiment of the present invention.
Figure 3:
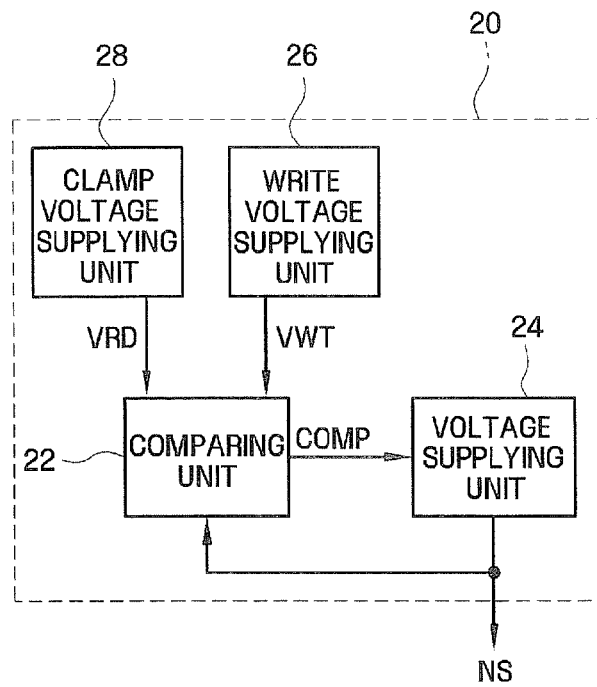
FIG. 3 is a block diagram illustrating a bit line level controller of FIG. 2 in more detail.

FIG. 2 is a block diagram illustrating a read/write merge circuit 10 that is used in a nonvolatile memory device according to an embodiment of the invention. FIG. 3 is a block diagram illustrating the bit line level controller of FIG. 2.

Figure 4:
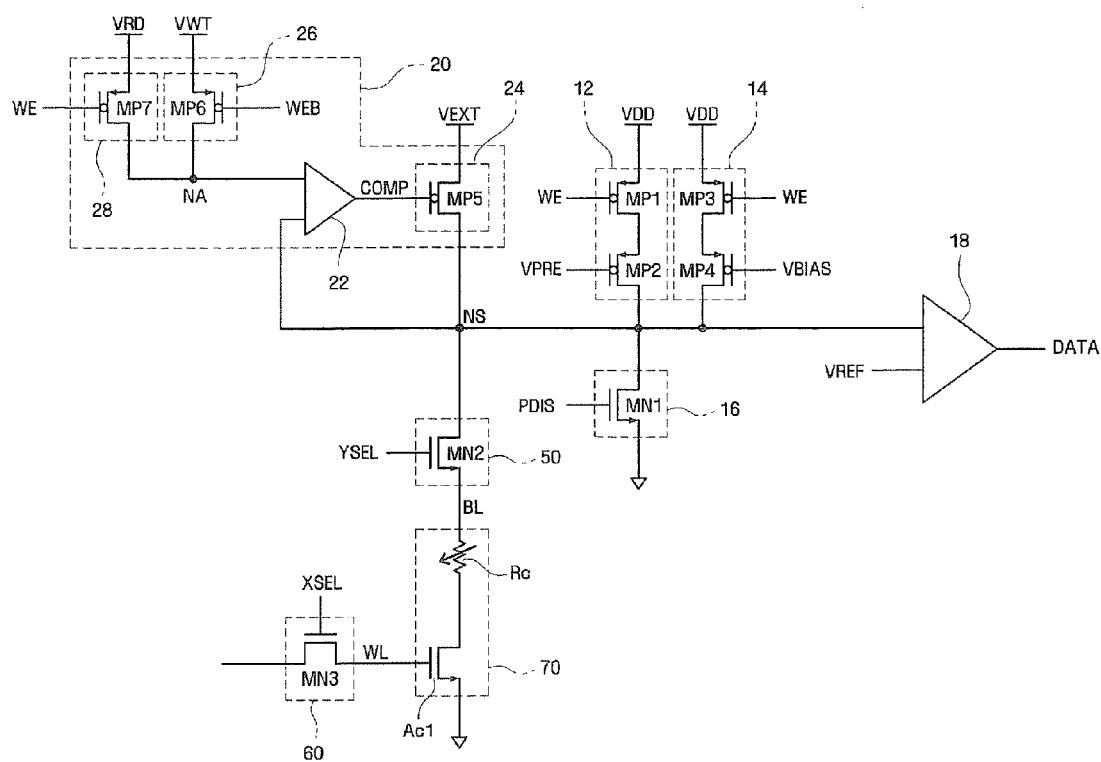
FIG. 4 is an exemplary circuit diagram illustrating a read/write merge circuit of FIGS. 2 and 3.

First, referring to FIGS. 2 to 4, the nonvolatile memory device according to the embodiment of the present invention includes the read/write merge circuit 10, the column selection circuit 50, the row selection circuit 60, and the nonvolatile memory cell 70. Specifically, the column selection circuit 50 receives a column selection signal YSEL and selects a bit line BL, and the row selection circuit 60 receives a row selection signal XSEL and selects a word line WL, such that the nonvolatile memory cell 70 on which a write or read operation is performed is selected. The read/write merge circuit 10 can perform both a write operation and a read operation. The read/write merge circuit 10 includes a precharge unit 12, a compensating unit 14, a discharge unit 16, a sense amplifier 18, and a bit line level controller 20.

The precharge unit 12 precharges the bit line BL to a predetermined level, for example, a power supply voltage VDD, through a sensing node NS before a sensing operation is performed by the sense amplifier 18. As shown in FIG. 4, the precharge unit 12 may include a PMOS transistor MP1 that is serially coupled between a power supply voltage terminal VDD and the sensing node NS and has a gate to which a write enable signal WE is applied, and a transistor MP2 that has a gate to which a precharge control signal VPRE is applied.

When the read operation starts, the discharge unit 16 discharges the bit line BL to a predetermined level, for example, a ground voltage VSS, through the sensing node NS before the precharge operation is performed by the precharge unit 12. Specifically, in the nonvolatile memory device according to the embodiment of the present invention, the reset voltage and the set voltage are supplied to the selected nonvolatile memory cell 70 through the sensing node NS that is coupled to the bit line BL so as to write the data. The data in the selected nonvolatile memory cell 70 is also read through the sensing node NS. Therefore, when the read operation is performed right after the write operation, a voltage level of the sensing node NS, which is increased by the reset voltage or the set voltage during the write operation, may affect the read operation. Therefore, in order to prevent this, when the read operation starts, the voltage level of the sensing node NS is first discharged. As shown in FIG. 4, the discharge unit 16 may include an NMOS transistor MN1 that is coupled between the sensing node NS and the ground voltage terminal VSS and has a gate to which a discharge control signal PDIS is applied.

The compensating unit 14 is enabled after the precharge unit 12 performs a precharge operation. The compensation unit 14 serves to supply a compensating current to the bit line BL through the sensing node NS in order to compensate for a decrease in the voltage level of the bit line BL that occurs when a cell current Icell flows through the selected nonvolatile memory cell 70. Specifically, when the nonvolatile memory cell 70 is in a set state, since resistance of the variable resistive element Rc is small, the amount of cell current Icell is relatively large. When the nonvolatile memory cell 70 is in a reset state, since resistance of the variable resistive element Rc is large, the amount of cell current Icell is relatively small. Here, the compensating unit 14 may supply the compensating current so that the cell current Icell in the reset state is compensated. In this way, the level of the sensing node NS remains approximately constant in the reset state, while the level of the sensing node NS decreases in the set state. Therefore, there will be a significant difference between the level of the sensing node NS in the reset state and the level of the sensing node NS in the set state, and thus it is relatively easy to differentiate the set state from the reset state. In this way, a sensing margin can be increased. As shown in FIG. 4, the compensating unit 14 may include a PMOS transistor MP3 that is serially coupled between the power supply voltage terminal VDD and the sensing node NS and has a gate to which a write enable signal WE is applied, and a PMOS transistor MP4 that has a gate to which a compensation control signal VBIAS is applied.

The sense amplifier 18 compares the level of the sensing node NS with a reference level REF and outputs a comparison result. According to the embodiment of the present invention, the sense amplifier 18 may be a current sense amplifier, which senses a change in the current flowing out through the bit line BL of the selected nonvolatile memory cell 70 with respect to the reference current, or a voltage sense amplifier, which senses a change in voltage with respect to a reference voltage.

During a read operation, the bit line level controller 20 supplies a clamp voltage VRD to the bit line BL and clamps the bit line BL within an appropriate level so as to read data of the bit line BL (i.e., within a predetermined level below a threshold voltage Vth of the variable resistive element). Further, during a write operation, the bit line level controller 20 supplies a write voltage VWT (i.e., reset voltage VRESET or set voltage VSET) to the bit line BL and writes data into the nonvolatile memory cell. Here, the reason why the bit line BL is clamped during a read operation is that when the variable resistive element is applied with a voltage larger than the threshold voltage Vth, data may be written into the variable resistive element of the selected nonvolatile memory cell 70. Thus, according to this embodiment of the invention, VRD<VRESET<VSET.

The bit line level controller 20 includes a comparing unit 22, a voltage supplying unit 24, a write voltage supplying unit 26, and a clamp voltage supplying unit 28. The comparing unit 22 receives a voltage level of the sensing node NS to be fed back, compares a voltage level of the write voltage VWT (i.e., reset voltage VRESET or set voltage VSET), which is supplied from the write voltage supplying unit 26, with the voltage level of the sensing node NS during the write operation, and supplies a comparison result COMP. During the read operation, the comparing unit 22 compares a voltage level of the clamp voltage VRD, which is supplied from the clamp voltage supplying unit 28, with the voltage level of the sensing node NS, and supplies a comparison result COMP. Here, the set voltage VSET has a higher level than the reset voltage VRESET, and the clamp voltage VRD has a lower voltage level than the reset voltage VRESET.

The voltage supplying unit 24 regulates the voltage level of the sensing node NS to the level of the write voltage VWT (i.e. voltage level of the reset voltage VRESET or the set voltage VSET) according to the comparison result COMP during the write operation. Further, the voltage supplying unit 24 regulates the voltage level of the sensing node NS to the voltage level of the clamp voltage VRD according to the comparison result COMP during the read operation.

The write voltage supplying unit 26 may be a PMOS transistor MP6 that is coupled between the write voltage terminal VWT and a node NA and has a gate to which a complementary signal WEB of the write enable signal WE is applied. The clamp voltage supplying unit 28 may be a PMOS transistor MP7 that is coupled between the clamp voltage terminal VRD and the node NA and has a gate to which the write enable signal WE is applied. The comparing unit 22 may be a unit gain amplifier that compares a voltage of the sensing node NS with a voltage of the node NA and outputs a comparison result COMP. The voltage supplying unit 24 may be a PMOS transistor MP5 that is coupled between an external power supply voltage terminal VEXT and the sensing node NS and has a gate to which the comparison result COMP is applied.

Accordingly, because the bit line level controller 20 used in the nonvolatile memory device according to embodiments of the present invention receives a voltage level of the sensing node NS to be fed back and controls the voltage level of the sensing node NS in response, a voltage level of the bit line BL or the sensing node NS can be accurately controlled to a desired voltage level, thereby increasing the reliability of the read/write operations. That is, the bit line level controller 20 can accurately control the voltage level of the bit line BL to the voltage level of the reset voltage VRESET or the set voltage VSET during the write operation, or clamp the bit line BL during the read operation. In addition, since manufacturers or designers can easily control the clamp voltage VRD and the write voltage VWT, for example, the voltage level at which the bit line BL is clamped during the read operation can be easily controlled by controlling the clamp voltage VRD. In addition, since both the write voltage supplying unit 26 and the clamp voltage supplying unit 28 are coupled to one comparing unit 22, the size of the comparing unit 22 that is provided in a chip can be minimized.

Figure 5:
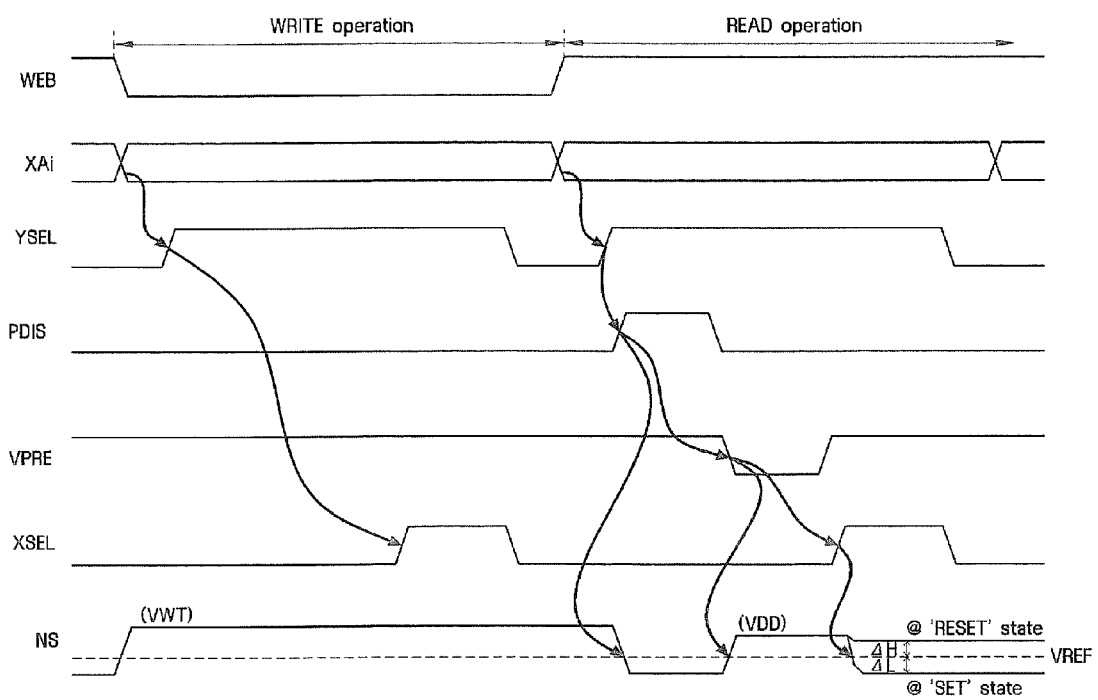
FIG. 5 is a timing diagram illustrating a write operation and a read operation of a nonvolatile memory device according to an embodiment of the present invention.

Hereinafter, with reference to FIGS. 2, 3, and 5, a write operation and a read operation of a nonvolatile memory device according to an embodiment of the present invention will be described. FIG. 5 is a timing diagram illustrating a write operation and a read operation of a nonvolatile memory device according to an embodiment of the present invention.

Since the complementary signal WEB of the write enable signal WE is at a low level, the write operation starts. The column selection signal YSEL is synchronized with the input address XAi and becomes a high level, such that a bit line BL is selected. Then, the row selection signal XSEL is synchronized with the column selection signal YSEL and becomes a high level, such that a word line WL is selected. In response to the active low level of the complementary signal WEB of the write enable signal WE, the read/write merge circuit 10 supplies a write voltage VWT (i.e., reset voltage VRESET or set voltage VSET) to the selected bit line BL, and writes the desired data into the selected nonvolatile memory cell.

During a read operation, the complementary signal WEB of the write enable signal WE is set to a high level. The column selection signal YSEL is synchronized with the input address XAi and becomes a high level, and a bit line BL is selected. Then, the discharge control signal PDIS becomes a high level and discharges the bit line BL through the sensing node NS. When the read operation is performed right after the write operation, the voltage level of the sensing node NS, which is increased by the reset voltage or the set voltage during the write operation, may affect the read operation. Therefore, in order to prevent this, the voltage level of the sensing node NS is discharged when the read operation starts.

After discharging the sensing node NS, the precharge control signal VPRE becomes a low level and precharges the bit line BL through the sensing node NS. The row selection signal XSEL also becomes a high level and a word line WL is selected.

Because the complementary signal WEB of the write enable signal WE is at a high level, the read/write merge circuit 10 clamps a voltage level of the selected bit line BL within an appropriate level so as to read data. Specifically, the voltage level of the selected bit line BL is clamped within a predetermined level below the threshold voltage Vth of the variable resistive element. The compensating unit 14 also supplies a compensating current to the sensing node NS so as to compensate for a decrease in the voltage level of the sensing node NS that occurs due to the current Icell that flows through the selected nonvolatile memory cell 70. In such a state, the cell current Icell that depends on the resistance of the selected nonvolatile memory cell 70 is generated. When the nonvolatile memory cell 70 is in a set state, since the resistance of the variable resistive element is small, the amount of cell current Icell is large. When the nonvolatile memory cell 70 is in a reset state, since the resistance of the variable resistive element is large, the amount of cell current Icell is small. However, since the compensating unit 14 supplies a compensating current, the level of the sensing node NS does not decrease significantly in the reset state, but the level of the sensing node NS decreases appreciably in the set state. Therefore, the sense amplifier 18 senses a difference ΔH between the level of the sensing node NS and the reference level VREF in the reset state or a difference ΔL between the level of the sensing node NS and the reference level VREF in the set state.

Figure 6:
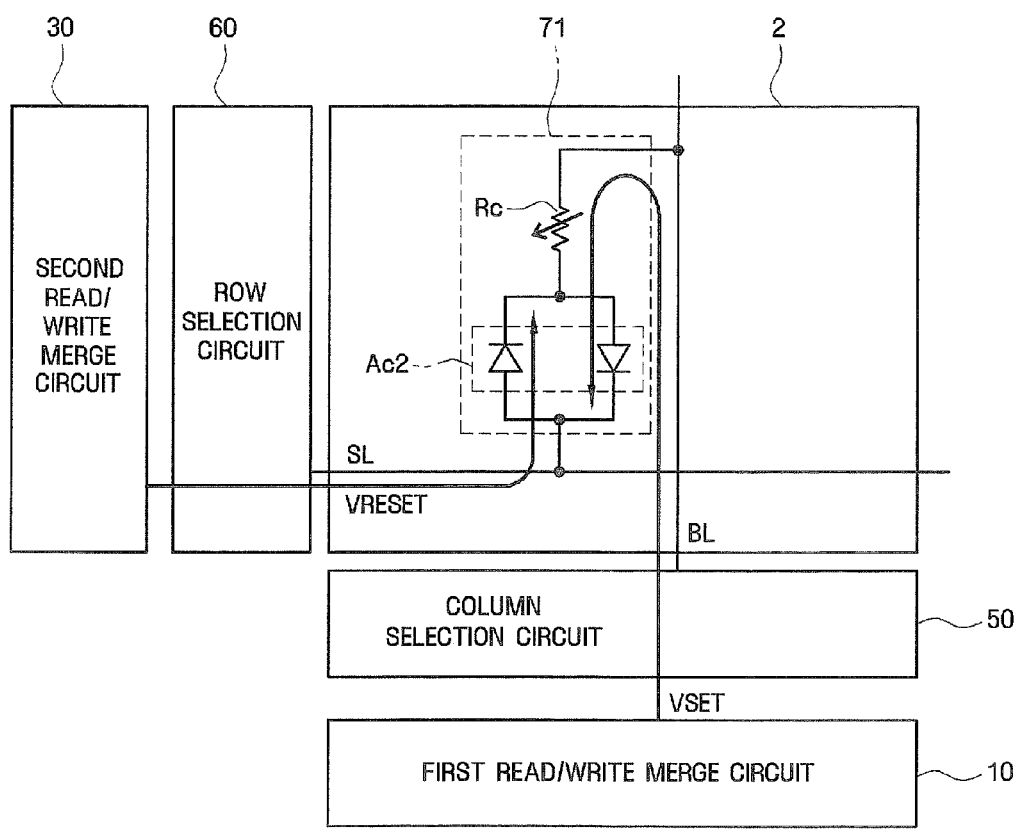
FIG. 6 is a block diagram illustrating a nonvolatile memory device according to another embodiment of the present invention.

FIG. 6 is a block diagram illustrating a nonvolatile memory device according to another embodiment of the present invention. The nonvolatile memory device of FIG. 6 may be, for example, a bi-directional memory device, but is not limited thereto. Like reference numerals refer to like elements that are substantially identical to those in FIG. 1. Detailed descriptions of the corresponding elements will be omitted.

Referring to FIG. 6, a nonvolatile memory device according to another embodiment of the present invention includes a memory cell array 2, a row selection circuit 60, a column selection circuit 50, a first read/write merge circuit 10, and a second read/write merge circuit 30.

Though not shown in detail in the drawing, the memory cell array 2 includes a plurality of bit lines BL, a plurality of sense lines SL, and a plurality of nonvolatile memory cells 71. Each of the nonvolatile memory cells 71 is coupled to each of the bit lines BL and each of the sense lines SL. Here, each of the nonvolatile memory cells 71 may include a variable resistive element Rc that has different resistance levels according to data and an access element Ac2 that controls a cell current flowing through the variable resistive element Rc. The variable resistive element Rc may include perovskites. The perovskites can be any number of compositions, including manganites (e.g., $Pr_{0.7}Ca_{0.3}MnO_3$, $Pr_{0.5}Ca_{0.5}MnO_3$ other PCMOs, LCMOs, etc.), titanates (e.g., STO:Cr), zirconates (e.g., SZO:Cr, $Ca_2Nb_2O_7$:Cr, and $Ta_2O_5$:Cr), and the like. The perovskites are taken as an example for the variable resistive element Rc, but the variable resistive element Rc is not limited thereto. The access element Ac2 may be composed of two diodes that are disposed in different directions.

The first and second read/write merge circuits 10 and 30 perform write and read operations in a selected nonvolatile memory cell 70. The first read/write merge circuit 10 writes set data by supplying a set voltage VSET to the selected nonvolatile memory cell 70. The second read/write merge circuit 10 writes reset data by supplying a reset voltage VRESET to the selected nonvolatile memory cell 70. As the description has been made referring to FIGS. 2 and 3, each of the first and second read/write merge circuits 10 and 30 may include a precharge unit 12, a compensating unit 14, a discharge unit 16, and a sense amplifier 18, and a bit line level controller 20, as illustrated by FIGS. 2-4.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

The invention claimed is:

1. An integrated circuit memory device, comprising:
    an array of nonvolatile memory cells having a first plurality of lines electrically coupled to memory cells therein; and
    a read/write control circuit configured to drive a selected one of the first plurality of lines with unequal write and read voltages during respective write and read operations, by regulating a sensing node therein at unequal write and read voltage levels using a line controller that receives a signal fed back from the sensing node, said read/write control circuit comprising a comparator having a first input terminal electrically coupled to the sensing node and a second input terminal responsive to an applied write voltage during the write operation and an applied read voltage, which is unequal to the applied write voltage, during the read operation.

2. The memory device of claim 1, wherein the line controller is responsive to a pair of complementary write enable signals.

3. The memory device of claim 1, wherein said read/write control circuit comprises a column selection circuit having an NMOS pass transistor therein; and wherein the NMOS pass transistor has a drain terminal connected to the sensing node and a source terminal electrically connected to a corresponding one of the first plurality of lines.

4. An integrated circuit memory device, comprising:
an array of nonvolatile memory cells having a first plurality of lines electrically coupled to memory cells therein; and
a read/write control circuit configured to drive a selected one of the first plurality of lines with unequal write and read voltages during respective write and read operations, by regulating a sensing node therein at write and read voltage levels using a line controller that receives a signal fed back from the sensing node;
wherein said read/write control circuit comprises a compensating unit responsive to a write enable signal, said compensating unit configured to provide a read compensation current to the selected one of the first plurality of lines during the read operation and comprising:
a first PMOS transistor having a gate terminal responsive to the write enable signal; and
a second PMOS transistor having a drain terminal electrically connected to the sensing node and a gate terminal responsive to a bias signal.

5. An integrated circuit memory device, comprising:
an array of nonvolatile memory cells having a first plurality of lines electrically coupled to memory cells therein; and
a read/write control circuit configured to drive a selected one of the first plurality of lines with unequal write and read voltages during respective write and read operations, by regulating a sensing node therein at write and read voltage levels using a line controller that receives a signal fed back from the sensing node, said read/write control circuit comprising:
a precharge unit configured to drive the sensing node with a precharge current during a portion of the read operation, said precharge unit comprising a totem pole arrangement of a first PMOS transistor having a gate terminal responsive to a write enable signal and a second PMOS transistor having a gate terminal responsive to a precharge control signal.

6. The memory device of claim 5, wherein the read/write control circuit further comprises a discharge unit electrically coupled to the sensing node, said discharge unit comprising an NMOS pull-down transistor having a gate terminal responsive to a discharge control signal.

7. An integrated circuit memory device, comprising:
an array of nonvolatile memory cells having a first plurality of lines electrically coupled to memory cells therein; and
a read/write control circuit responsive to a pair of complementary write enable signals, said read/write control circuit configured to drive a selected one of the first plurality of lines with unequal write and read voltages during respective write and read operations;
wherein said read/write control circuit comprises a line controller having an input and an output electrically coupled to a sensing node of said read/write control circuit, which is regulated at the write and read voltages during respective write and read operations;
wherein the line controller comprises a comparator having a first input electrically coupled to the sensing node; and
wherein the line controller is configured to selectively pass an applied read voltage to a second input of the comparator during the read operation and an applied write voltage to the second input of the comparator during the write operation; and wherein the applied write voltage is unequal to the applied read voltage.

8. The memory device of claim 7, wherein said read/write control circuit comprises a compensating unit responsive to one of the pair of complementary write enable signals, said compensating unit configured to provide a read compensation current to the selected one of the first plurality of lines during the read operation.

9. A nonvolatile memory device comprising:
a memory cell array having a plurality of first lines, a plurality of second lines, and a plurality of nonvolatile memory cells correspondingly coupled to the first lines and the second lines;
a selection circuit selecting at least one nonvolatile memory cell among the plurality of nonvolatile memory cells;
a first read/write merge circuit having a first line level controller supplying a write voltage to the first line, which is coupled to the selected nonvolatile memory cell among the plurality of nonvolatile memory cells, so as to write data into the nonvolatile memory cell during a write operation, and supplying a clamp voltage to the first line so as to clamp the first line during a read operation, a compensating unit supplying a compensating current to the first line so as to compensate for a decrease in the voltage level of the first line that occurs due to a cell current flowing through the selected nonvolatile memory cell during the read operation, and a sense amplifier comparing a level of the first line with a reference level and outputting a comparison result during the read operation; and
a second read/write merge circuit having a second line level controller supplying a write voltage to a second line, which is coupled to a selected nonvolatile memory cell among the plurality of nonvolatile memory cells, so as to write data into the nonvolatile memory cell during a write operation, and supplying a clamp voltage to the second line so as to clamp the second line during a read operation, a compensating unit supplying a compensating current to the second line so as to compensate for a decrease in the level of the second line that occurs due to a cell current flowing through the selected nonvolatile memory cell during the read operation, and a sense amplifier comparing a level of the second line with a reference level during the read operation and outputs a comparison result.

10. The nonvolatile memory device of claim 9, further comprising:
a sensing node coupled to the second line,
wherein the second line level controller comprises a comparing unit receiving a voltage level of the sensing node to be fed back, and comparing the voltage level of the sensing node with a voltage level of a write voltage to output a comparison result during the write operation, and compares the voltage level of the sensing node with a voltage level of the clamp voltage to output a comparison result during the read operation, and a voltage supplying unit controlling the voltage level of the sensing node to a voltage level of the write voltage according to the comparison result during the write operation, and controlling the voltage level of the sensing node to a voltage level of the clamp voltage according to the comparison result during the read operation.

* * * * *